(12) United States Patent
Kubonaka et al.

(10) Patent No.: US 12,725,768 B2
(45) Date of Patent: Sep. 1, 2026

(54) ELECTRONIC CLEANING DEVICE

(71) Applicant: Hitachi High-Tech Corporation, Tokyo (JP)

(72) Inventors: Yuto Kubonaka, Tokyo (JP); Masaomi Ohno, Tokyo (JP); Koichiro Takeuchi, Tokyo (JP); Kotaro Hosoya, Tokyo (JP)

(73) Assignee: Hitachi High-Tech Corporation, Tokyo (JP)

( * ) Notice: Subject to any disclaimer, the term of this patent is extended or adjusted under 35 U.S.C. 154(b) by 288 days.

(21) Appl. No.: 18/716,198

(22) PCT Filed: Dec. 24, 2021

(86) PCT No.: PCT/JP2021/048174

§ 371 (c)(1),
(2) Date: Jun. 4, 2024

(87) PCT Pub. No.: WO2023/119619

PCT Pub. Date: Jun. 29, 2023

(65) Prior Publication Data

US 2025/0037962 A1 Jan. 30, 2025

(51) Int. Cl.
*H01J 37/32* (2006.01)

(52) U.S. Cl.
CPC .............................. *H01J 37/32862* (2013.01)

(58) Field of Classification Search
CPC .... H01J 37/32862; H01J 37/241; H01J 37/06; H01J 37/16; H01J 37/165; H01J 37/28; H01J 2237/022; H01J 2237/026
USPC .......................................................... 250/310
See application file for complete search history.

(56) References Cited

U.S. PATENT DOCUMENTS

| | | | | |
|---|---|---|---|---|
| 9,248,207 | B1 | 2/2016 | Heyoung | |
| 2020/0206789 | A1* | 7/2020 | Morikawa | H01J 37/20 |
| 2021/0043414 | A1 | 2/2021 | Sato et al. | |

FOREIGN PATENT DOCUMENTS

| | | | |
|---|---|---|---|
| JP | 6-84850 | A | 3/1994 |
| JP | 6-267493 | A | 9/1994 |
| JP | 2010-103072 | A | 5/2010 |
| JP | 2015-69734 | A | 4/2015 |

(Continued)

OTHER PUBLICATIONS

International Search Report (PCT/ISA/210) issued in PCT Application No. PCT/JP2021/048174 dated Mar. 22, 2022 with English translation (5 pages).

(Continued)

*Primary Examiner* — Kiet T Nguyen
(74) *Attorney, Agent, or Firm* — Crowell & Moring LLP

(57) ABSTRACT

A hydrocarbon gas, which is a precursor of contamination, is dissociated by electron irradiation of a cleaner using electrons, carbon is deposited on members in a sample chamber and on a surface of a sample, and components inside the sample chamber are contaminated. Therefore, a device is provided that includes a sample chamber 101 connected to a lens barrel 112 having a charged particle source 113, an electron source 102 disposed in a sample chamber 101, and a shield plate 105 disposed in front of the electron source 102. An inside of the sample chamber is cleaned by secondary electrons emitted when primary electrons emitted from the electron source collide with the shield plate.

6 Claims, 5 Drawing Sheets

(56) References Cited

FOREIGN PATENT DOCUMENTS

| | | | |
|---|---|---|---|
| JP | 2016-54136 | A | 4/2016 |
| WO | WO 2019/155540 | A1 | 8/2019 |

OTHER PUBLICATIONS

Japanese-language Written Opinion (PCT/ISA/237) issued in PCT Application No. PCT/JP2021/048174 dated Mar. 22, 2022 with English translation (9 pages).

International Preliminary Report on Patentability (PCT/IPEA/409) issued in PCT Application No. PCT/JP2021/048174 dated May 31, 2023 (3 pages).

* cited by examiner

[FIG. 1]
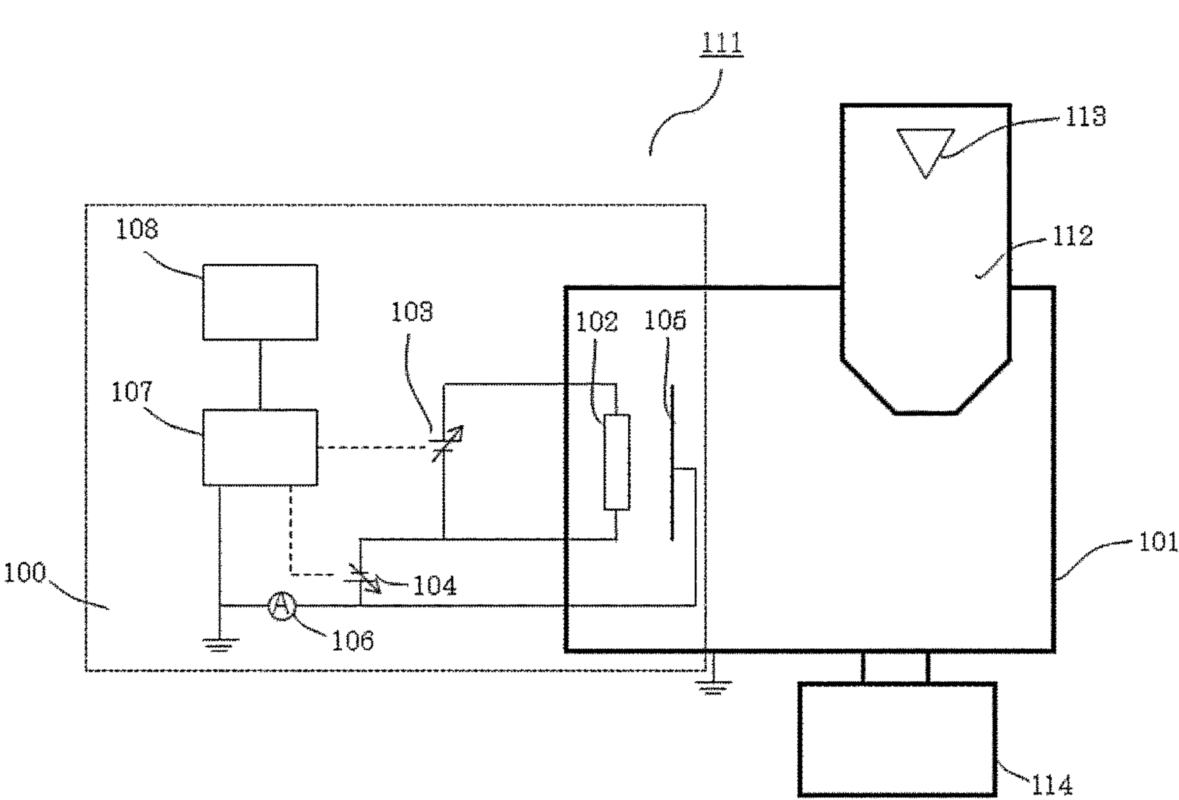

[FIG. 2]
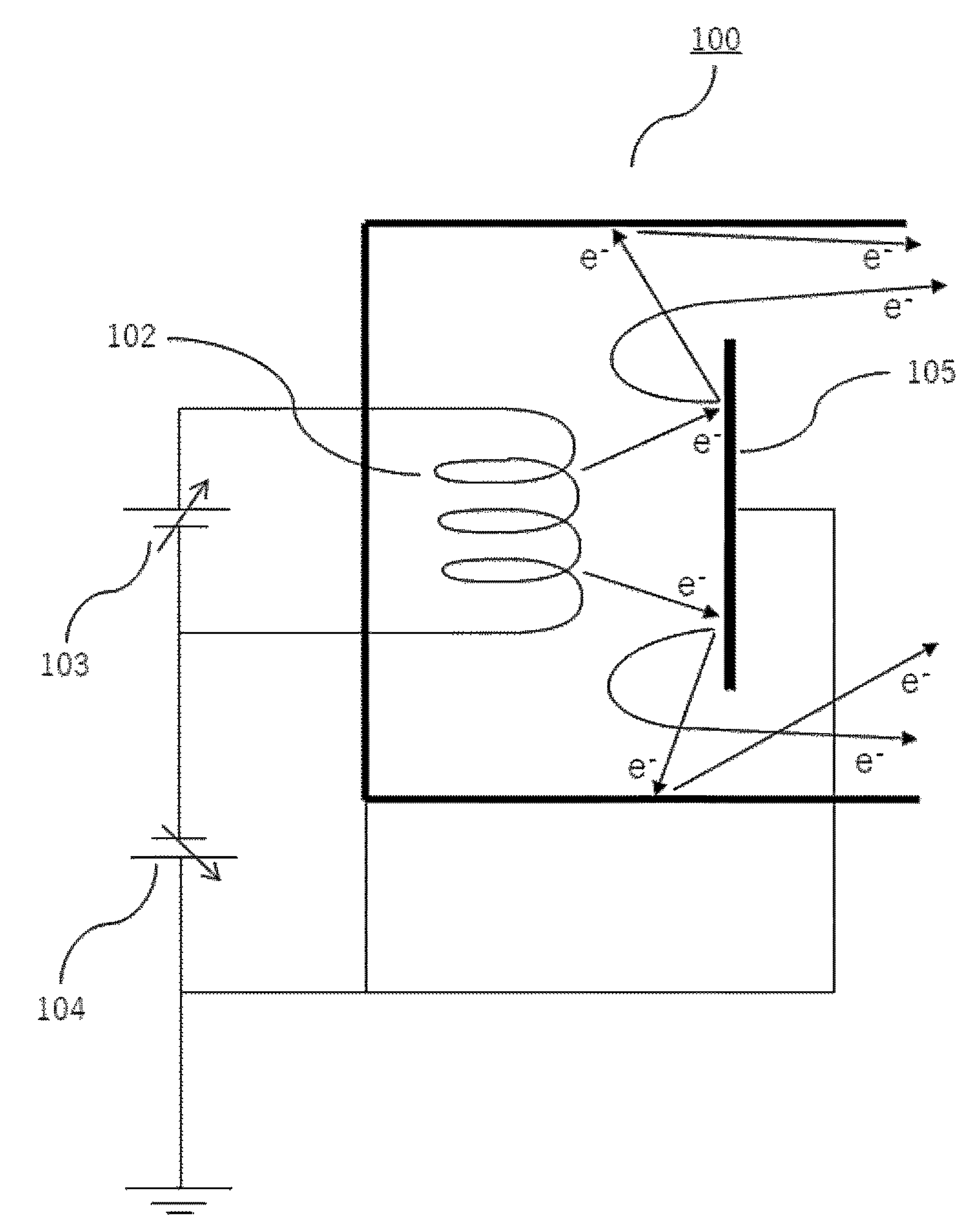

[FIG. 3]
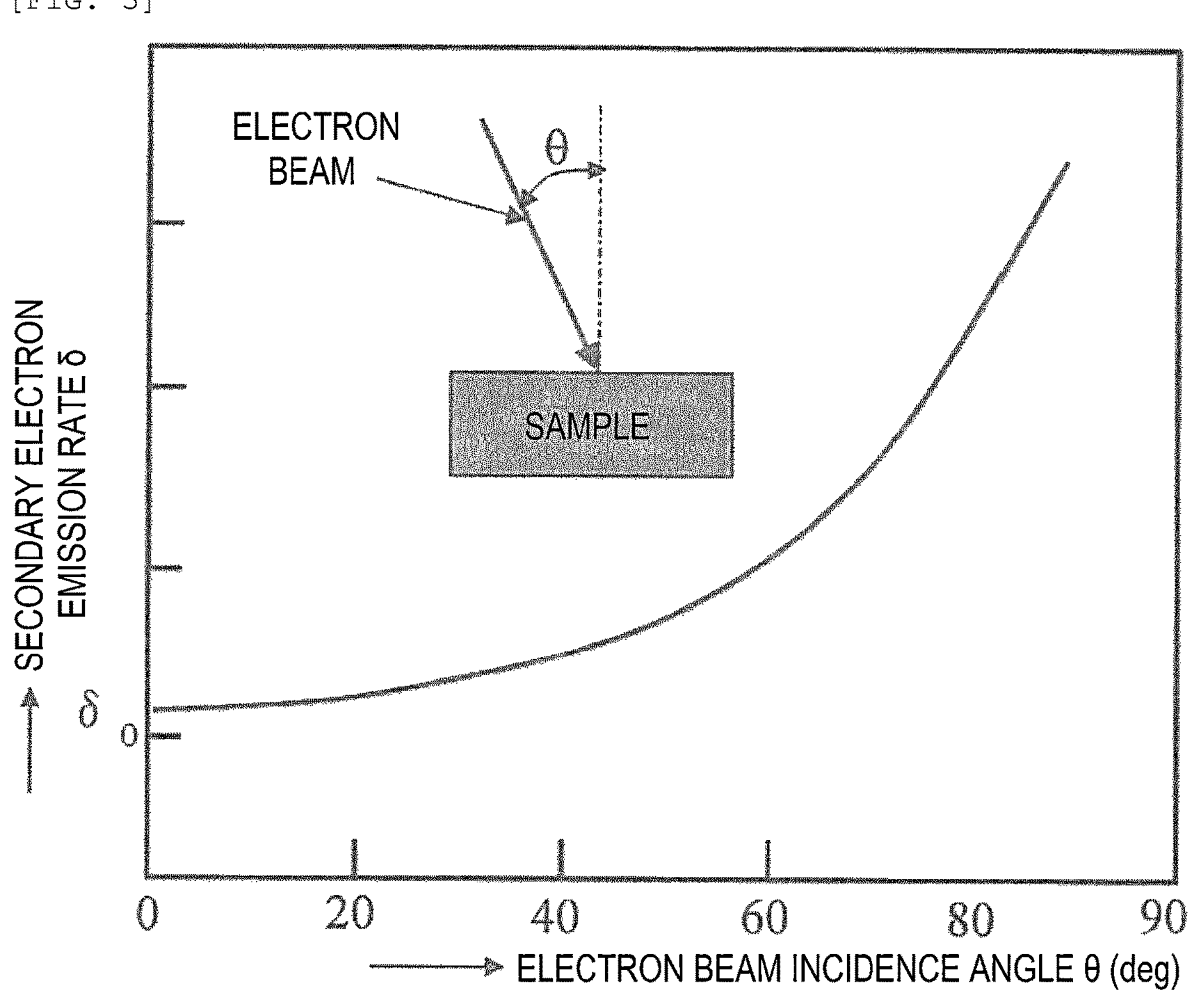

[FIG. 4]
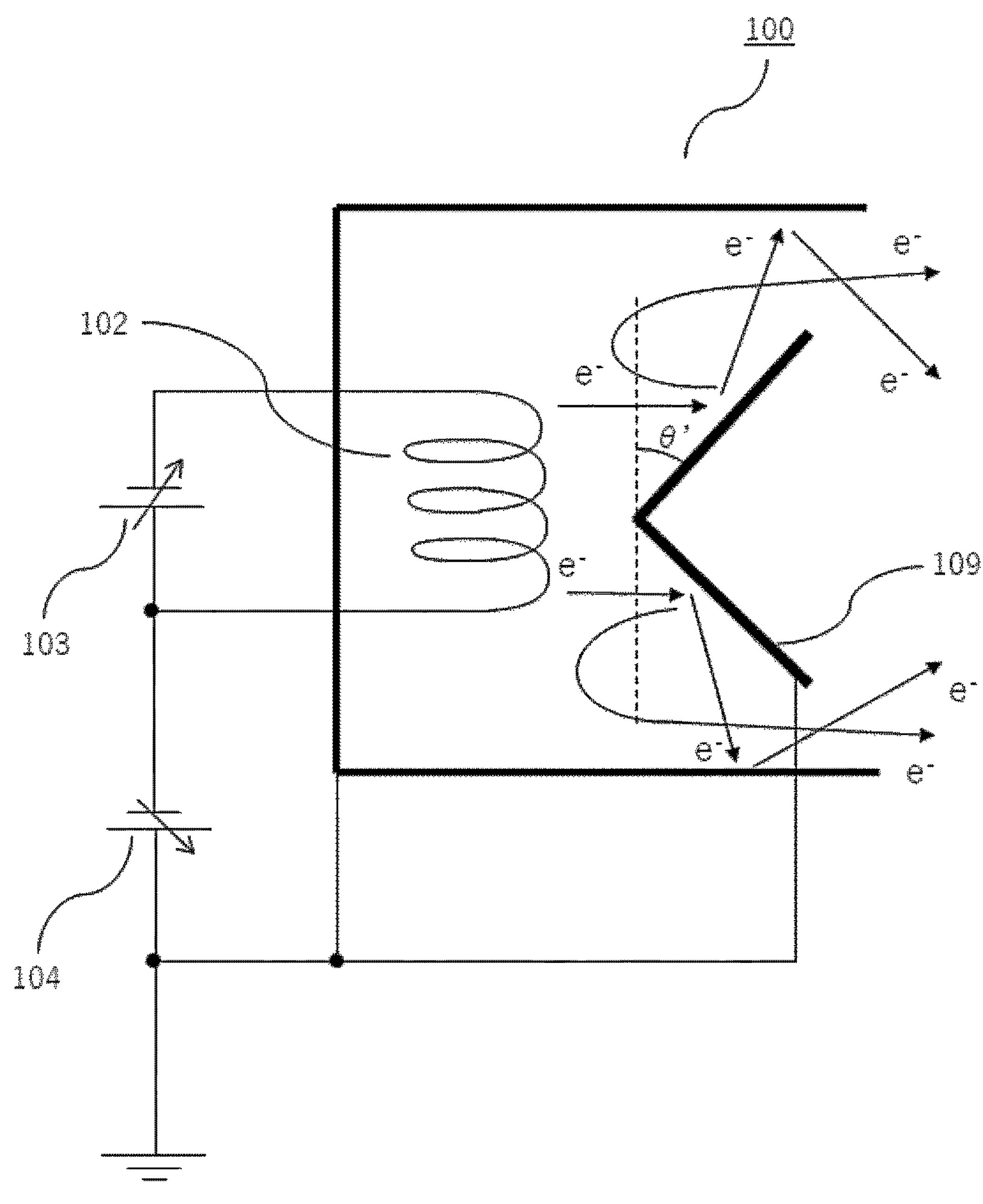

[FIG. 5]
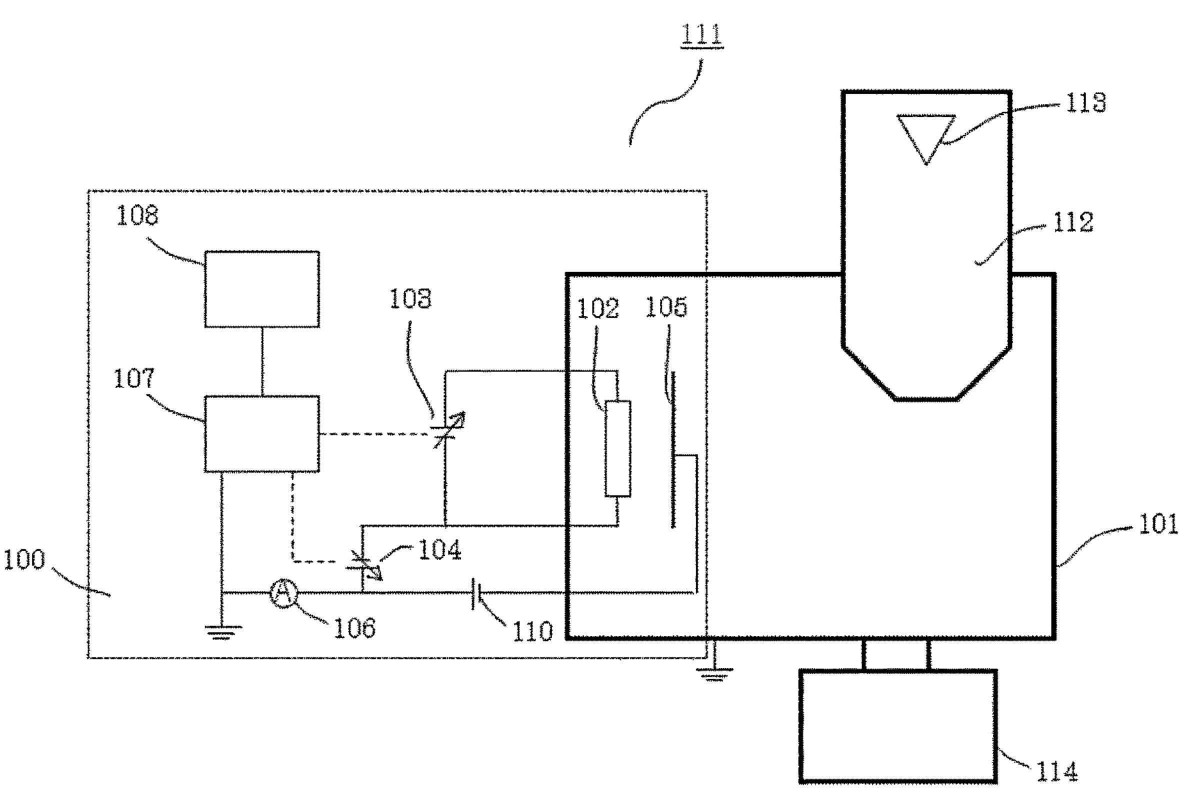

ELECTRONIC CLEANING DEVICE

TECHNICAL FIELD

The present invention relates to an electronic cleaning device.

BACKGROUND ART

In a charged particle beam apparatus represented by an electron microscope or the like, an impurity is deposited on an object to be irradiated (a sample or the like) due to irradiation with a charged particle beam (contamination is caused). When contamination occurs, various problems occur. For example, an S/N ratio of an electron microscopy image is deteriorated, or a sample surface shape is changed, making analysis of sample information difficult.

In order to reduce the influence of contamination, as techniques in the related art, there are a method of heating the apparatus body with a heater (PTL 1), a method of irradiating the apparatus body with ultraviolet light (PTL 2), and a method of using plasma (PTL 3). However, it may be difficult to maintain an ultra-high vacuum inside the apparatus due to an outgas caused by heat, gas introduction at the time of plasma generation, and the like. Further, application to a sample that is sensitive to heat or ultraviolet light is difficult. PTL 4 discloses a cleaning device capable of maintaining an ultra-high vacuum inside the device. Further, since the cleaning is performed using electrons, application to a sample handled by a charged particle apparatus is easy.

CITATION LIST

Patent Literature

PTL 1: JP2010-103072A
PTL 2: JP2015-69734A
PTL 3: JP2016-54136A
PTL 4: WO19/155540

SUMMARY OF INVENTION

Technical Problem

In PTL 4 described above, a problem has been found that a hydrocarbon gas, which is a precursor of contamination, is dissociated by electron irradiation of a cleaner using electrons, carbon is deposited on members in a sample chamber and on a surface of a sample, and components inside the sample chamber are contaminated.

Solution to Problem

In order to solve the above problems, the invention provides a cleaning device including: a sample chamber connected to a lens barrel having a charged particle source; an electron source disposed in the sample chamber; and a shield plate disposed in front of the electron source. An inside of the sample chamber is cleaned by secondary electrons emitted when primary electrons emitted from the electron source collide with the shield plate.

Advantageous Effects of Invention

According to the invention, it is possible to provide a cleaning device capable of cleaning a sample chamber while restricting dissociation of a hydrocarbon gas, with an ultra-high vacuum maintained inside the device without complicating the device.

BRIEF DESCRIPTION OF DRAWINGS

FIG. 1 is a diagram illustrating an example of an overall configuration of a charged particle beam apparatus including a cleaning device according to Embodiment 1.

FIG. 2 is a diagram illustrating a process of emitting electrons into a sample chamber.

FIG. 3 is a graph illustrating a change in emission efficiency of secondary electrons with respect to an electron beam incidence angle.

FIG. 4 is a diagram illustrating a cleaning device in which a shield plate is changed to a structure having high secondary-electron emission efficiency.

FIG. 5 is a diagram illustrating an example of an overall configuration of a charged particle beam apparatus including a cleaning device according to Embodiment 2.

DESCRIPTION OF EMBODIMENTS

Hereinafter, embodiments of the invention will be described in order with reference to the drawings. Embodiment 1

FIG. 1 is a schematic diagram of a charged particle beam apparatus according to Embodiment 1. The embodiment is an embodiment of a cleaning device, the cleaning device including a sample chamber connected to a lens barrel having a charged particle source, an electron source disposed in the sample chamber, and a shield plate disposed in front of the electron source. An inside of the sample chamber is cleaned by secondary electrons emitted when primary electrons emitted from the electron source collide with the shield plate.

In the drawing, a charged particle beam apparatus 111 includes a lens barrel 112 having a charged particle beam source 113, an electronic cleaning device 100, a sample chamber 101, and a vacuum pump 114 configured to evacuate the sample chamber 101. The electronic cleaning device 100 includes an electron source 102 including a filament provided inside the sample chamber 101, an electron source power supply 103 configured to generate a current for heating the electron source 102, a bias power supply 104 configured to apply a voltage to the electron source 102, a shield plate 105 configured to collide with electrons emitted from the electron source 102, an ammeter 106 configured to measure a current (hereinafter, an emission current) emitted from the electron source 102, a control unit 107 configured to control various components, a storage unit 108 configured to store a control condition, a current amount, and the like.

The cleaning device 100 is a device that desorbs a hydrocarbon gas, which is a precursor of contamination physically adsorbed on an inner wall of the sample chamber 101 or a structure in the sample chamber, by electron irradiation and exhausts the hydrocarbon gas by a vacuum pump, thereby cleaning an inner portion of the sample chamber.

The electron irradiation may cause a dissociation phenomenon in addition to the desorption phenomenon of the hydrocarbon gas. The dissociation phenomenon is a phenomenon in which a hydrocarbon gas is decomposed into carbon and hydrogen by electron irradiation. When the physically adsorbed hydrocarbon gas is dissociated, only the carbon sticks and the sample chamber 101 is contaminated.

The dissociation phenomenon occurs at an energy of a few eV, and the desorption phenomenon occurs at an energy of 1 eV or less. By causing only the desorption phenomenon using the energy difference, it is possible to restrict the contamination of the sample chamber 101 and remove the hydrocarbon gas.

The energy of electrons emitted from the electron source 102 is controlled using the bias power supply 104, and the energy of the electrons can be reduced by decreasing the voltage of the bias power supply. However, if the voltage of the bias power supply is decreased, the number of electrons emitted to the sample chamber 101 decreases, and accordingly the cleaning efficiency decreases.

Therefore, in the configuration of the embodiment, secondary electrons generated when primary electrons emitted from the electron source 102 collide with the shield plate 105 and an inner wall of the cleaning device 100 are used to maintain the cleaning effect and restrict the dissociation phenomenon.

FIG. 2 is a diagram illustrating a flow in which the cleaning device 100 emits electrons into the sample chamber 101. Secondary electrons generated by collision with the shield plate 105 and the inner wall of the cleaning device 100 repeat deflection by an electric field generated by a voltage (acceleration voltage) applied to the electron source 102 by the bias power supply 104 and collision in the cleaning device 100, and are emitted into the sample chamber 101. Therefore, the amount of secondary electrons emitted into the sample chamber 101 depends on the acceleration voltage and the structure and arrangement of the shield plate.

The secondary electrons entering the sample chamber 101 collide with the inner wall or a component of the sample chamber 101. When there is the hydrocarbon gas physically adsorbed to a collision destination, the hydrocarbon gas is desorbed. The desorbed hydrocarbon gas is removed from the inside of the sample chamber 101 by two methods.

One is a method of exhaustion by the vacuum pump 114. The other is a method of causing primary electrons having high energy emitted from the electron source 102 to collide with the hydrocarbon gas floating in the sample chamber 101 to dissociate the hydrocarbon gas.

The desorbed hydrocarbon gas may be physically adsorbed in the sample chamber 101 again, and is desorbed by irradiation of the secondary electrons again. The desorption is repeated until the desorbed hydrocarbon is removed from the inside of the sample chamber 101.

In the latter method, when the hydrocarbon gas is removed, it is conceivable that a large amount of carbon is deposited on the shield plate 105 which is most irradiated with the primary electron. When carbon is deposited on the shield plate 105, it is conceivable that the generation efficiency of the secondary electrons decreases and the cleaning efficiency decreases. Therefore, the shield plate 105 is preferably designed to be easily replaceable.

As described above, the shield plate 105 of the embodiment has three roles. The first role is a shielding function for preventing primary electrons of high energy, which are emitted from the electron source 102 and accelerated by the bias power supply 104, from being directly emitted into the sample chamber 101. The second role is a generation source of secondary electrons for desorbing the hydrocarbon gas physically adsorbed on the inner wall of the sample chamber 101. The third role is to trap carbon when the hydrocarbon gas floating in the sample chamber 101 collides with the primary electrons emitted from the electron source 102 and a dissociation phenomenon occurs.

Even in actual experimental results, it was confirmed that the cleaning effect was obtained while restricting contamination in the sample chamber 101. It was also confirmed that carbon was trapped on the shield plate.

A graph illustrating a change in secondary-electron emission rate with respect to an electron beam incidence angle is shown in FIG. 3. It is known that the emission efficiency of the secondary electrons is increased by increasing an incidence angle θ of the electron beam. FIG. 4 illustrates a configuration of the cleaning device 100 in which the shield plate 105 is changed to a bent shield plate 109.

In order to improve the cleaning efficiency, it is possible to increase the number of secondary electrons emitted into the sample chamber 101. As illustrated in FIG. 3, in order to improve generation efficiency of the secondary electrons, the angle θ of an irradiation direction may be increased on a surface irradiated with the primary electrons. When a bending angle of the shield plate is defined as θ', the irradiation angle θ of the primary electrons and the θ' are equal to each other. Therefore, as illustrated in FIG. 4, the incidence angle of the primary electrons is increased by using the bent shield plate 109. Accordingly, it is considered that the generation efficiency of the secondary electrons can be improved and the improvement in the cleaning efficiency can be achieved.

The generation efficiency of the secondary electrons improves as the θ' increases. However, as the θ' increases, it is necessary to enlarge the shield plate 109 in order to shield the primary electrons. Therefore, the shape of the shield plate 109 needs to be determined in consideration of the structure of the cleaning device 100 and the sample chamber 101.

In order to improve the generation efficiency of the secondary electrons, the shield plates 105 and 109 are preferably formed of a material having high secondary-electron generation efficiency such as aluminum, gold, or titanium. A material having high secondary-electron generation efficiency may be applied to surfaces of the shield plates 105 and 109.

By roughening the surfaces of the shield plates 105 and 109, the emission efficiency of the secondary electrons becomes higher by an edge effect. Therefore, the shield plates 105 and 109 are preferably roughened. Further, the shield plates 105 and 109 may be positively roughened by processing.

Embodiment 2

Embodiment 2 is an embodiment of a charged particle apparatus including, in addition to the configuration in Embodiment 1, a bias power supply configured to apply a negative voltage to a shield plate. That is, the embodiment is an embodiment of a cleaning device that further includes a bias power supply connected to a shield plate and in which a negative voltage is applied to the shield plate by the bias power supply to increase an emission amount of secondary electrons.

In order to improve the cleaning performance of the cleaning device 100 according to Embodiment 1, it is important to increase the emission amount of the secondary electrons. Therefore, in the embodiment, by applying a negative voltage to the shield plate 105 that is a generation source of secondary electrons, the emission amount of the secondary electrons is increased and the cleaning performance is improved.

FIG. 5 illustrates an example of an overall configuration of the cleaning device according to Embodiment 2. In addition to the configuration in Embodiment 1, a bias power supply 110 configured to apply a negative voltage to the shield plate 105 is provided. For example, when the bias power supply 104 applies a voltage of −100 V with respect to the sample chamber 101 of a ground potential to the electron source 102, the energy of primary electrons is about 100 eV. At this time, if −1 V is applied to the shield plate 105 by the bias power supply 110, the primary electrons reach the shield plate 105 at the energy of about 99 eV while being decelerated. By the arrival of the primary electrons, a large amount of the secondary electrons are emitted from the shield plate 105 to which the negative voltage is applied, as compared with a case where no voltage is applied. Thus, the emission amount of the secondary electrons can be increased.

For example, when the bias power supply 104 applies a voltage of −100 V to the electron source 102 and the bias power supply 110 applies a voltage of −101 V to the shield plate 105, the primary electrons cannot reach the shield plate and secondary electrons cannot be generated. Therefore, the voltage applied by the bias power supply 110 is necessarily lower than the voltage applied by the bias power supply 104.

From the shield plate 105 to which a negative voltage is applied by the bias power supply 104, the emitted secondary electrons are accelerated by the negative voltage applied by the bias power supply. For example, when the negative voltage applied by the bias power supply 110 is −99 V, the energy of the emitted secondary electrons when reaching the inside of the sample chamber 101 is energy obtained by adding 99 eV to the energy when the secondary electrons are generated. As a result, the dissociation phenomenon frequently occurs and the inside of the sample chamber is contaminated.

As described above, a magnitude of the negative voltage to be applied to the shield plate 105 by the bias power supply 110 needs to be appropriate energy in consideration of a magnitude of the negative voltage to be applied to the electron source 102 by the bias power supply 104 and the energy of the generated secondary electrons.

The invention is not limited to the embodiments described above, and includes various modifications. For example, the above embodiments have been described in detail for better understanding of the invention, and the invention is not necessarily limited to those including all the configurations described above.

REFERENCE SIGNS LIST

100: CLEANING DEVICE
101: SAMPLE CHAMBER
102: ELECTRON SOURCE
103: ELECTRON SOURCE POWER SUPPLY
104: BIAS POWER SUPPLY
105: SHIELD PLATE
106: AMMETER
107: CONTROLLER
108: STORAGE UNIT
109: SHIELD PLATE
110: BIAS POWER SUPPLY
111: CHARGED PARTICLE BEAM APPARATUS
112: LENS BARREL
113: CHARGED PARTICLE SOURCE
114: VACUUM PUMP

The invention claimed is:

1. A cleaning device comprising:
a sample chamber connected to a lens barrel having a charged particle source;
an electron source disposed in the sample chamber; and
a shield plate disposed in front of the electron source, wherein
an inside of the sample chamber is cleaned by secondary electrons that are emitted when primary electrons emitted from the electron source collide with the shield plate and that have energy of 1 eV or less for causing a desorption phenomenon of a hydrocarbon gas.

2. The cleaning device according to claim 1, wherein
the shield plate is disposed such that the primary electrons emitted from the electron source are not directly emitted to the inside of the sample chamber.

3. The cleaning device according to claim 1, wherein
the shield plate is detachable and replaceable.

4. The cleaning device according to claim 1, wherein
the shield plate is formed of a material having high secondary-electron emission efficiency, or a material having high secondary-electron emission efficiency is applied to a surface of the shield plate.

5. The cleaning device according to claim 1, wherein
the electron source includes a filament, and
an installation angle of the shield plate with respect to the filament is changed to increase an emission rate of the secondary electrons.

6. The cleaning device according to claim 1, further comprising:
a bias power supply connected to the shield plate, wherein
a negative voltage is applied to the shield plate by the bias power supply to increase an emission amount of the secondary electrons.

* * * * *